United States Patent
Hirabayashi

(10) Patent No.: US 8,023,351 B2
(45) Date of Patent: Sep. 20, 2011

(54) SEMICONDUCTOR MEMORY DEVICE

(75) Inventor: Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 186 days.

(21) Appl. No.: 12/558,393

(22) Filed: Sep. 11, 2009

(65) Prior Publication Data

US 2010/0232244 A1 Sep. 16, 2010

(30) Foreign Application Priority Data

Mar. 16, 2009 (JP) .................................. 2009-63575

(51) Int. Cl.
*G11C 7/02* (2006.01)
(52) U.S. Cl. ..................... 365/208; 365/230.06; 365/163
(58) Field of Classification Search .................. 365/208, 365/230.06, 210, 163, 189.09, 203, 185.25, 365/185.11, 63, 230.03, 185.2, 185.21
See application file for complete search history.

(56) References Cited

U.S. PATENT DOCUMENTS 7,907,439 B2 * 3/2011 Kushida et al. ............... 365/156
2006/0083064 A1 * 4/2006 Edahiro et al. ........... 365/185.17

OTHER PUBLICATIONS

K. Nii et al.,"A 45-nm Single-port and Dual-port SRAM family with Robust Read/Write Stabilizing Circuitry under DVFS Environment," 2008 Symposium on VLSI Circuits Digest of Technical Papers, pp. 212-213.
Background Art Information.

* cited by examiner

*Primary Examiner* — Dang T Nguyen
(74) *Attorney, Agent, or Firm* — Knobbe, Martens, Olson & Bear LLP

(57) ABSTRACT

A semiconductor memory device comprises: a memory cell array including a plurality of word lines, a plurality of bit line pairs containing a first bit line and a second bit line, and a plurality of memory cells; a plurality of replica bit lines formed in the same manner as the first and second bit lines; a write buffer circuit operative to drive the first or second bit line to the ground voltage; a replica write buffer circuit operative to drive the replica bit lines to the ground voltage; and a boot strap circuit operative to drive the first or second bit line currently driven to the ground voltage further to a negative potential at a timing when the potential on the replica bit lines reaches a certain value.

20 Claims, 8 Drawing Sheets

SEMICONDUCTOR MEMORY DEVICE

CROSS-REFERENCE TO RELATED APPLICATION

This application is based upon and claims the benefit of priority from prior Japanese Patent Application No. 2009-063575, filed on Mar. 16, 2009, the entire contents of which are incorporated herein by reference.

BACKGROUND OF THE INVENTION

1. Field of the Invention

The present invention relates to a semiconductor memory device, and more particularly to a semiconductor memory device operable on low voltage, such as an SRAM (Static Random Access Memory).

2. Description of the Related Art

An LSI used in mobile instruments is required to reduce the power consumption to extend the battery-driven time. Lowering the supply voltage is effective to reduce the power consumption. An increase in characteristic dispersion among elements due to the progression of scaling in recent years, however, reduces the operational margin of the SRAM used in the LSI and makes it difficult to lower the operating voltage of the SRAM. The operating voltage of the SRAM defines the supply voltage of the LSI and accordingly makes it difficult to lower the supply voltage of the entire LSI. Operation of the SRAM on lower supply voltage deteriorates the write characteristic of the SRAM as a problem.

To deal with this problem, a method has been proposed, which comprises shifting one of two bit lines connected to an SRAM cell to a negative potential on writing (see K. Nii et al., "A 45-nm Single-port and Dual-port SRAM family with Robust Read/Write Stabilizing Circuitry under DVFS Environment", 2008 Symposium on VLSI Circuits Digest of Technical Papers, P 212-213) When a boot strap circuit is used to shift one of the bit lines to the negative potential, a gate-source voltage of a transfer NMOS transistor in the SRAM cell can be boosted, thereby improving the write characteristic of the SRAM.

The use of the boot strap circuit to shift the bit line to the negative potential on writing, however, causes the following problem. The timing of shifting the bit line to the negative potential by the boot strap circuit and the level of the negative potential applied to the bit line vary depending on the capacitance of the bit line and so forth. A number of SRAMs having different word line lengths and bit line lengths are used inside the LSI. The bit lines having different bit line lengths differ from each other in bit line capacitance. Therefore, the timing of shifting the bit line to the negative potential and the level of the negative potential applied to the bit line may vary and deteriorate the characteristic of writing data to the SRAM possibly.

SUMMARY OF THE INVENTION

In an aspect the present invention provides a semiconductor memory device, comprising: a memory cell array including a plurality of word lines, a plurality of bit line pairs containing a first bit line and a second bit line intersecting the word lines, and a plurality of memory cells connected at the intersections of the plurality of word lines and the plurality of bit line pairs; a plurality of replica bit lines formed in the same manner as the first and second bit lines; a write buffer circuit operative to drive the first or second bit line to the ground voltage on writing data to the memory cell; a replica write buffer circuit operative to drive the replica bit lines to the ground voltage by substantially the same driving force as that of the write buffer circuit; and a boot strap circuit operative to drive the first or second bit line currently driven to the ground voltage further to a negative potential at a timing when the potential on the replica bit lines reaches a certain value.

In another aspect the present invention provides a semiconductor memory device, comprising: a memory cell array including a plurality of word lines, a plurality of bit line pairs containing a first bit line and a second bit line intersecting the word lines, and a plurality of memory cells connected at the intersections of the plurality of word lines and the plurality of bit line pairs; a write buffer circuit operative to drive the first or second bit line to the ground voltage on writing data to the memory cell; and a boot strap circuit operative to drive the first or second bit line currently driven to the ground voltage further to a negative potential at a certain timing, wherein the boot strap circuit includes a potential control circuit operative to vary the value of the negative potential applied to the first or second bit line in accordance with the voltage value of the supply voltage, wherein the potential control circuit makes the negative potential larger in the negative direction as the voltage value of the supply voltage descends.

In yet another aspect the present invention provides a semiconductor memory device, comprising: a memory cell array including a plurality of word lines, a plurality of bit line pairs containing a first bit line and a second bit line intersecting the word lines, and a plurality of memory cells connected at the intersections of the plurality of word lines and the plurality of bit line pairs; a write buffer circuit operative to drive the first or second bit line to the ground voltage on writing data to the memory cell; a boot strap circuit operative to drive the first or second bit line currently driven to the ground voltage further to a negative potential at a certain timing; and a voltage sense circuit operative to sense if the voltage value of the supply voltage is lower than a certain voltage value to provide a control signal for controlling operation of the boot strap circuit, wherein the boot strap circuit drives the first or second bit line to the negative potential, based on the control signal, if the voltage value of the supply voltage is lower than the certain voltage value.

DETAILED DESCRIPTION OF THE EMBODIMENTS

The embodiments associated with the semiconductor memory device according to the present invention will now be described in detail with reference to the drawings.

First Embodiment

Figure 1:
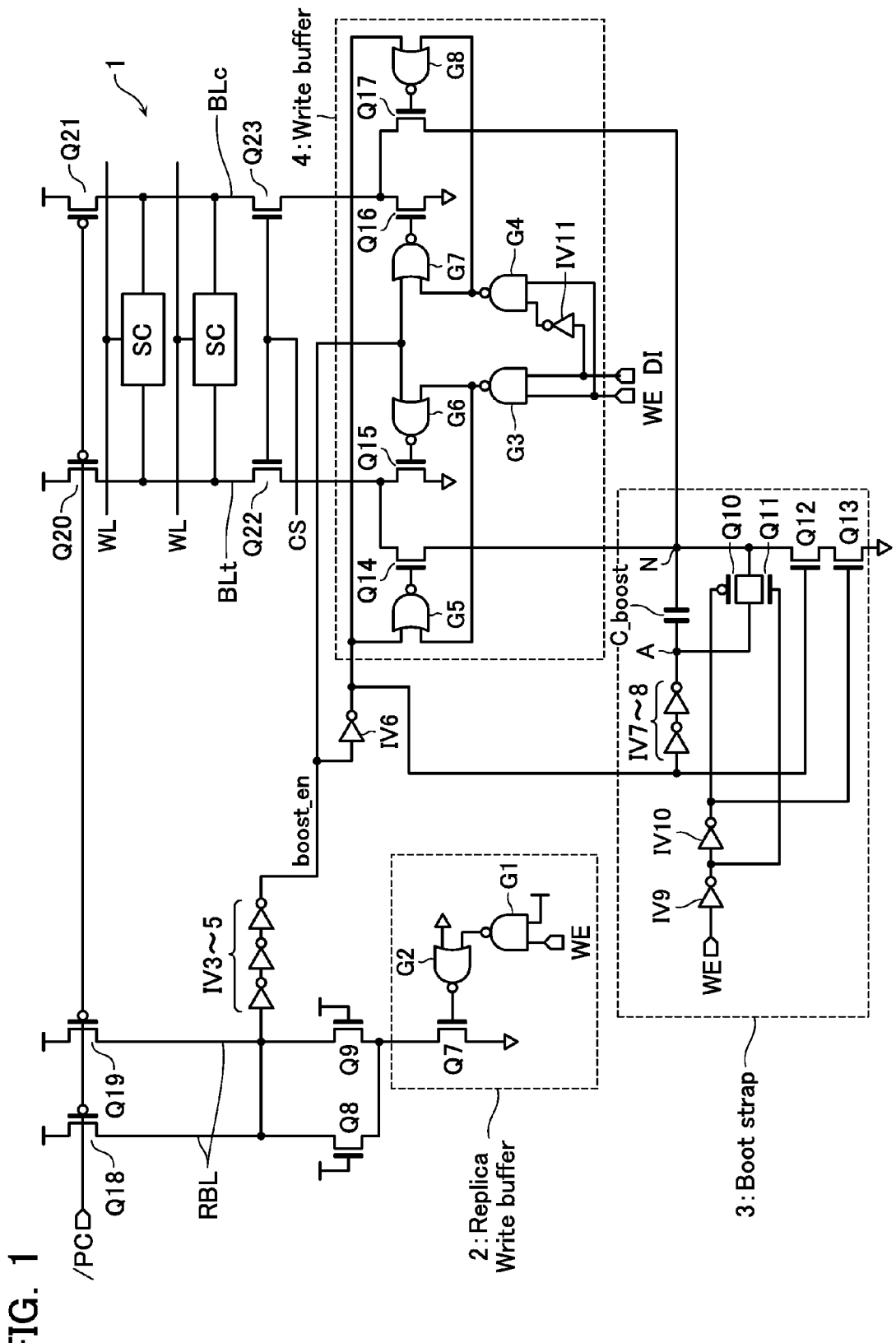
FIG. 1 is a circuit diagram showing a configuration of a semiconductor memory device according to a first embodiment.
Figure 2:
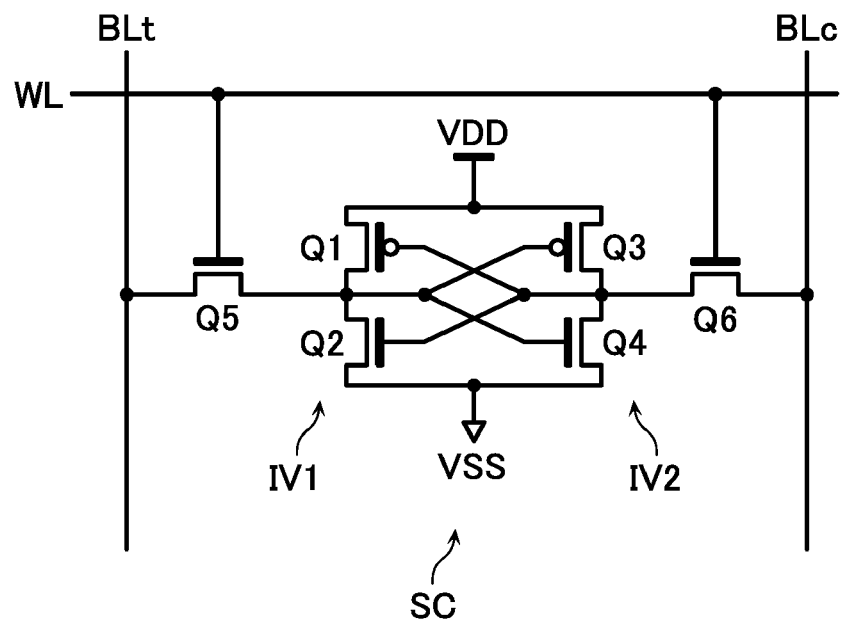
FIG. 2 is a circuit diagram showing a memory cell of the 6-transistor type in the semiconductor memory device according to the first embodiment.

FIG. 1 is a circuit diagram showing a configuration of a semiconductor memory device according to a first embodiment of the present invention. FIG. 2 is a circuit diagram showing the details of an SRAM cell shown in FIG. 1. FIG. 1 shows a circuit used in controlling the bit line voltage on writing to the SRAM cell.

[Configuration]

The semiconductor memory device according to the present embodiment comprises a memory cell array 1, and a write buffer circuit 4 operative to selectively drive a bit line pair BL connected to an SRAM cell SC in the memory cell array 1. The semiconductor memory device also comprises a replica write buffer circuit 2 and a boot strap circuit 3 for adjusting the timing of applying a voltage to the bit line pair BL on writing and the value of the voltage applied to the bit line pair BL. Although not shown in FIG. 1, the semiconductor memory device may comprise a row decoder operative to select a word line, and a controller operative to control these circuits.

The memory cell array 1 includes a plurality of word lines WL, a plurality of bit line pairs BL of bit lines BLt, BLc, and a plurality of SRAM cells SC connected at the intersections of the word lines WL and the bit line pairs BL. The SRAM cell SC is a memory cell of the 6-transistor type as shown in FIG. 2. Namely, the memory cell of the 6-transistor type includes a first inverter IV1 containing a PMOS transistor Q1 and an NMOS transistor Q2 connected in series and having sources connected to the supply line VDD and the ground line VSS, respectively, and a second inverter IV2 containing a PMOS transistor Q3 and an NMOS transistor Q4 connected in series and having sources connected to the supply line VDD and the ground line VSS, respectively. These inverters IV1, IV2 have respective inputs and outputs mutually cross-connected. Between the bit line BLt and the output terminal of the first inverter IV1, a first transfer transistor Q5 is connected. Between the bit line BLc and the output terminal of the second inverter IV2, a second transfer transistor Q6 is connected. The first and second transfer transistors Q5, Q6 have respective gate terminals connected to the word line WL. Writing to the memory cell of the 6-transistor type is executed using both the bitlines BLt, BLc. In contrast, reading may be single-ended reading executed from either of the bit lines BLt, BLc. In the present embodiment the bit lines BLt, BLc are assumed to have a bit line capacitance C_bl each.

As shown in FIG. 1, in the semiconductor memory device according to the present embodiment, two replica bit lines RBL having almost the same length as the bit line pair BL are disposed. The bit line pair BL and the replica bit lines RBL are connected to the supply line VDD to precharge the bit line pair BL and the replica bit lines RBL via PMOS transistors Q18-Q21. The replica bit lines RBL are connected to the replica write buffer circuit 2 via NMOS transistors Q8, Q9. In the present embodiment, the replica bit lines RBL are substantially same in length as the bit line pair BL and disposed two. Therefore, the entire of the replica bit lines RBL has double the capacitance of the bit line BLt or the bit line BLc.

The replica write buffer circuit 2 includes a NAND gate G1, a NOR gate G2 and an NMOS transistor Q7. The gate G1 receives a write enable signal WE. The gate G1 has an output terminal connected to the gate terminal of the transistor Q7 via the gate G2. The replica bit lines RBL are connected to the ground line VSS via the transistor Q7. The replica write buffer circuit 2 has a function of driving the precharged replica bit lines RBL to the ground voltage, based on the write enable signal WE.

The replica bit lines RBL are connected to a plurality of inverters IV3-IV5 in series. The potential on the replica bit lines RBL is provided as a boost enable signal boost_en, via the inverters IV3-IV5. The inverters IV3-IV5 have a circuit threshold, which is set almost half the voltage value of the supply voltage VDD. Namely, the inverters IV3-IV5 have a function of inverting the output signal, that is, the boost enable signal boost_en from "L" to "H" when the voltage on the replica bit lines RBL descends from the precharged voltage VDD to around ½ the voltage VDD. The inverter IV5 has an output terminal connected via an inverter IV6 to the boot strap circuit 3 and the write buffer circuit 4.

The boot strap circuit 3 includes inverters IV7-IV10, transistors Q10-Q13 and a boot-strap capacitor C_boost. The inverter IV6 has an output terminal connected via the inverters IV7-IV8 to a node A at one end of the capacitor C_boost. The other end of the capacitor C_boost is defined as a node N. Between the node A and the node N, the PMOS transistor Q10 and the NMOS transistor Q11 are connected in parallel with the capacitor C_boost. The transistor Q10 has a gate terminal, which receives the write enable signal WE via the inverters IV9, IV10. The transistor Q11 has a gate terminal, which receives the write enable signal WE via the inverter IV9. The node N is connected to the ground line VSS via the NMOS transistors Q12, Q13 for discharging the node N. The transistor Q12 has a gate terminal, which receives the boost enable signal boost_en via the inverter IV6. The transistor Q13 has a gate terminal, which receives the write enable signal WE via the inverters IV9, IV10. The boot strap circuit 3 has a function of shifting the potential on the node N to a negative potential on execution of writing, and then applying the negative potential on the node N to the bit line pair BL via the write buffer circuit 4 to drive either of the bit line BLt or BLc to the negative potential, as described later.

The write buffer circuit 4 includes an inverter IV11, NMOS transistors Q14-Q17, NAND gates G3, G4 and NOR gates G5-G8. The gate G3 receives the write enable signal WE and a data signal DI. The gate G4 receives the write enable signal WE and the data signal DI via the inverter IV11. The gate G3 has an output terminal connected to the gates G5, G6. The gate G4 has an output terminal connected to the gates G7, G8. The gates G5, G8 have input terminals, which receive the boost enable signal boost_en via the inverter IV6. The gates G6, G7 have input terminals, which receive the boost enable signal boost_en. The gates G5-G8 have output terminals connected to the gate terminals of the transistors Q14-Q17, respectively.

The bit lines BLt, BLc in the memory cell array 1 are connected to the write buffer circuit 4 via NMOS transistors Q22, Q23. The transistors Q22, Q23 are controlled to turn on/off by a column selection signal CS fed to the gate terminals. The bit lines BLt, BLc are connected to the ground line VSS via the transistors Q15, Q16 in the write buffer circuit 4. The bit lines BLt, BLc are also connected to the node N in the boot strap circuit 3 via the transistors Q14, Q17 in the write buffer circuit 4. The write buffer circuit 4 has a function of discharging either of the pair of bit lines BL to 0 V in accordance with write data at the start of writing. The replica write buffer circuit 2 and the write buffer circuit 4 both use NMOS transistors to drive the replica bit lines RBL and the bit line pair BL to the ground voltage. These NMOS transistors can be formed through the same process to allow the replica bit lines RBL and the bit line pair BL to have almost the same driving force.

Figure 3:
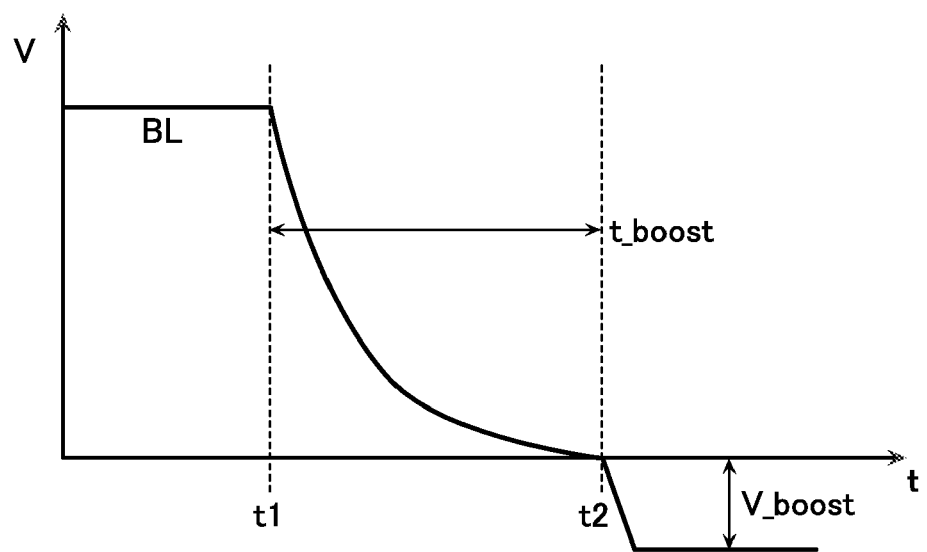
FIG. 3 is a waveform diagram of the bit line potential on writing in the semiconductor memory device.

Prior to describing operation of the SRAM in the present embodiment, the following description is made with reference to FIG. 3 on a problem that may arise on execution of writing to the SRAM cell SC while the potential of one of the bit line pair BL is shifted to a negative potential. FIG. 3 is a waveform diagram of the potential on the bit line to which a negative potential is applied on writing in the semiconductor memory device.

On writing data to the SRAM cell SC, the word line WL is booted to turn on the transfer transistors Q5, Q6 in the SRAM cell SC. In addition, one of the pair of bit lines BL is brought to the supply voltage VDD and the other to the negative potential using the boot strap circuit to feed data to the inverters IV1, IV2 in the SRAM cell SC.

When it is intended to use the boot strap circuit to bring the bit line BL to the negative potential on writing, the following problem may occur. In the boot strap circuit, after the beginning of data writing (after time t1 in FIG. 3), the boot strap circuit is activated at the timing when the bit line BL to be brought to the negative potential reaches 0 V, (time t2 after time t_boost shown in FIG. 3 elapsed), to generate the negative potential applied to the bit line BL. At this time, if the potential on the bit line BL does not descend sufficiently, the bit line BL cannot be brought to a sufficient negative potential. If a sufficient time is ensured (the time t_boost is made longer) to allow the potential on the bit line BL to descend sufficiently, the time for the entire of writing is made longer as a problem.

The SRAM cells SC in the memory cell array differ from each other in the word line length and the bit line length. The bit lines BL having different bit line lengths differ from each other in the bit line capacitance and accordingly differ in time for the potential on the bit line BL to descend. The timing (time t2) of activating the boot strap circuit may be set in accordance with the time for the potential on the bit line BL having the longest bit line length to descend. In this case, though, SRAM cells SC having shorter bit line lengths tend to have excessive timing margins.

The potential level V_boost of the negative potential generated at the boot strap circuit can be determined by the ratio between the capacitance on the bit line BL and the capacitance inside the boot strap circuit. A variation in the bit line length changes the capacitance on the bit line BL and accordingly the potential level V_boost of the negative potential generated at the boot strap circuit varies as a problem. If the boot strap circuit is designed to generate a desired negative potential V_boost in a configuration with the longest bit line length, it generates negative potentials more than required for shorter bit line lengths. In this case, if the potential level on the bit line BL descends excessively, in SRAM cells SC, which are connected to the same bit line BL as the selected SRAM cell but associated word line WL are not selected, the gate-source voltage of the transfer transistors Q5, Q6 may possibly exceed the threshold voltage and destruct data held therein. Further, writing to the selected SRAM cell may possibly supply the transfer transistors Q5, Q6 with a higher potential than the breakdown voltage thereof.

[Operation]

The following description is given to data writing with the use of the replica write buffer circuit 2, the boot strap circuit 3 and the write buffer circuit 4 of the present embodiment shown in FIG. 1. Prior to writing, a precharge signal/PC is first made "L" to precharge the bit line pair BL and the replica bit lines RBL via the transistors Q18-Q21.

At the beginning of writing, the write enable signal WE fed to the replica write buffer circuit 2, the bootstrap circuit 3 and the write buffer circuit 4 is made "H" at the same timing to operate these circuits. In addition, the selected word line WL is boosted to "H" to turn on the transfer transistors Q5, Q6 in the SRAM cell SC. The boost enable signal boost_en is still at "L" because the replica bit lines RBL are precharged to the supply voltage VDD.

The write buffer circuit 4 receives the write enable signal WE and the boost enable signal boost_en, on writing, as well as a data signal DI corresponding to write data. The data signal DI is herein assumed at "H". When the write enable signal WE and the data signal DI are at "H", the gate G3 provides an output signal at "L". In this case, the boost enable signal boost_en is at "L" and the gate G6 provides an output signal at "H", which allows the bit line BLt to be discharged to 0 V through the transistor Q15. On the other hand, the gate G4 provides an output signal at "H", which allows the gates G7, G8 to provide output signals at "L" regardless of the state of the boost enable signal boost_en. This prevents the transistors Q16, Q17 from turning on and keeps the bit line BLc on the precharged voltage VDD.

In the boot strap circuit 3, as the boost enable signal boost_en is at "L" before writing, the voltage VDD appears on the node A at one end of the capacitor C_boost via the inverters IV6-IV8. In addition, as the write enable signal WE is also at "L", the node N at the other end is short-circuited with the node A via the transistors Q10, Q11, and thus the voltage VDD also appears thereon. When the write enable signal WE is turned to "H" to start writing, the transistors Q12, Q13 turn on to discharge the node N gradually. The transistors Q12, Q13 are set smaller in driving force than the transistors Q15, Q16 in the write buffer circuit 4 and the transistor Q7 in the replica write buffer circuit 4, and provided as a discharge circuit for the capacitor C_boost.

When the write enable signal WE is turned to "H", the replica write buffer circuit 2 turns on the transistor Q7 to start discharging the replica bit lines RBL. When the voltage on the replica bit lines RBL is discharged to around ½ the voltage VDD, the boost enable signal boost_en output from the inverters IV3-IV5 is inverted to "H". As described above, the capacitance on the replica bit lines RBL is almost double the capacitance of the bit line BLt. Monitoring the timing of discharging the replica bit lines RBL to around ½ the voltage VDD through the replica write buffer circuit 2 makes it possible to monitor the timing of discharging the normal bit line BLt to almost 0 V regardless of the bit line length.

When the boost enable signal boost_en turns from "L" to "H", in the write buffer circuit 4, the output signal from the gate G6 turns from "H" to "L" and the output signal from the gate G5 turns from "L" to "H". As a result, the transistor Q15 turns off, and the transistor Q14 connected to the node N in the boot strap circuit 3 turns on instead.

When the boost enable signal boost_en turns from "L" to "H", in the boot strap circuit 3, the potential on the node A turns from the supply voltage VDD to the ground voltage 0 V.

At this time, the capacitive coupling with the capacitor C_boost varies the potential on the node N in the negative direction. If the node N has been discharged to 0 V, the capacitive coupling with the capacitor C_boost brings the node N to around a voltage, −VDD. Thereafter, in accordance with the ratio between the capacitance C_bl on the bit line BLt and the capacitance on the capacitor C_boost in the boot strap circuit 3, charges are redistributed to determine the potential level Vbl on the bit line BLt as represented by the following expression 1.

$$Vbl = -VDD * C\_boost/(C\_bl + C\_boost) \quad \text{[Expression 1]}$$

If the capacitance of the capacitor C_boost is sufficiently smaller than the capacitance C_bl on the bit line BLt, the potential level Vbl on the bit line BLt can be briefly represented by the following expression 2.

$$Vbl = -VDD * C\_boost/C\_bl \quad \text{[Expression 2]}$$

Through the above operation, the bit line BLt of the bit line pair BL is brought to the negative potential and the bit line BLc to the supply voltage VDD. In the SRAM cell SC targeted for data write, the transfer transistors Q5, Q6 are turned on. The potentials on the bit lines BLt, BLc are fed via the transfer transistors Q5, Q6 to the inverters IV1, IV2 in the SRAM cell SC to write data in the SRAM cell SC.

[Effect]

Figure 4:
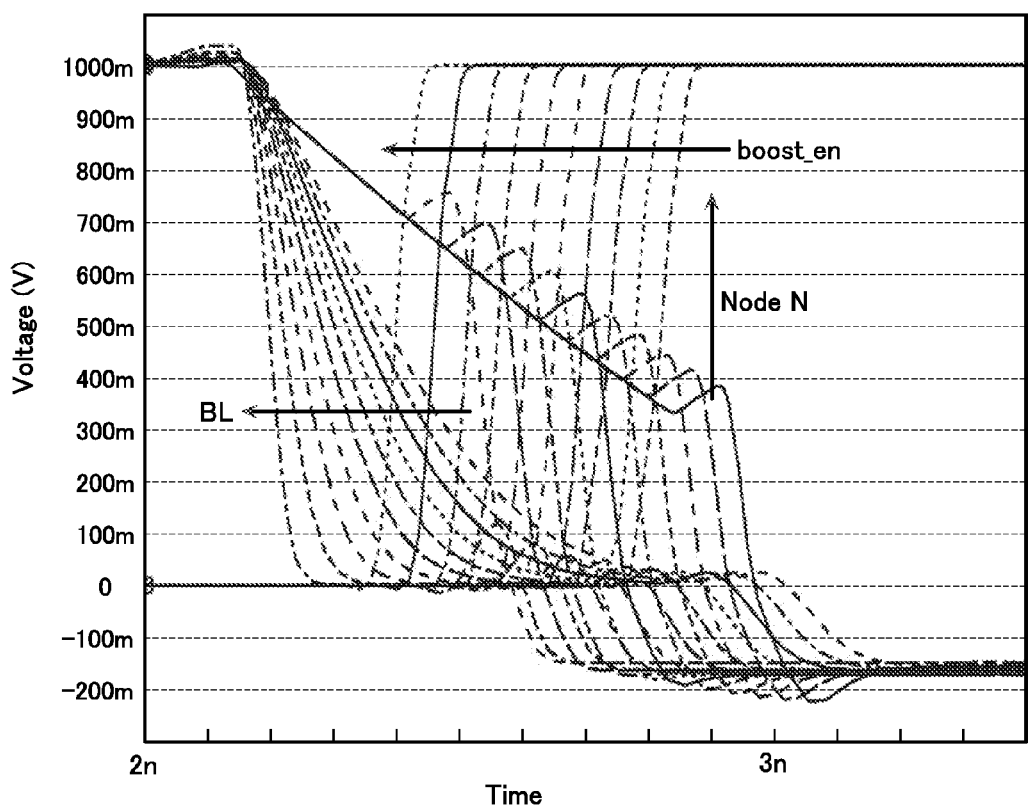
FIG. 4 is a waveform diagram on writing in the semiconductor memory device according to the first embodiment.
Figure 5:
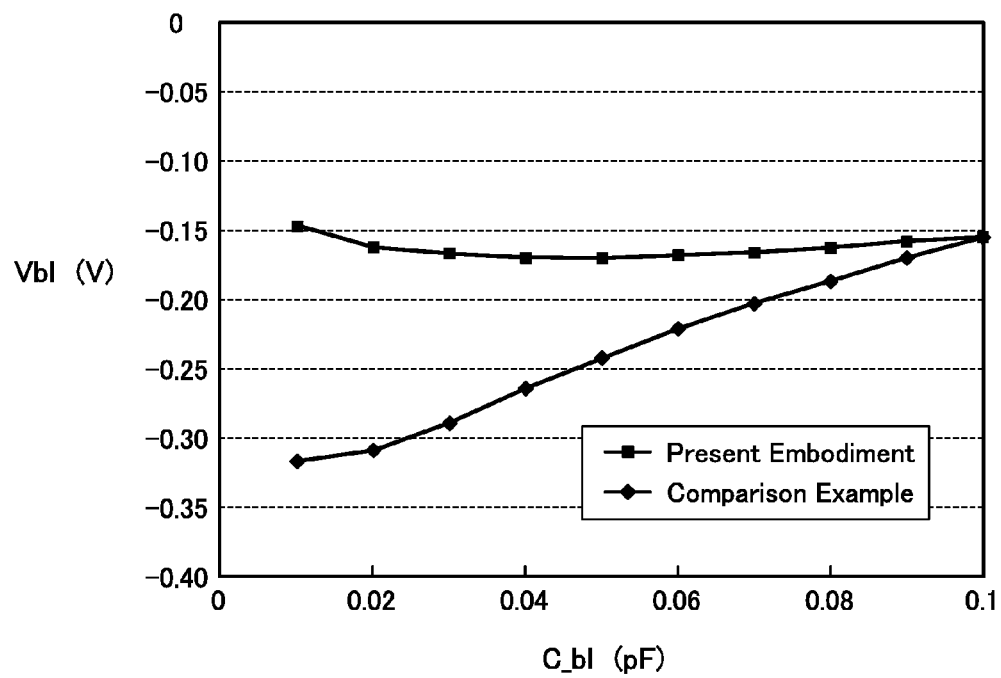
FIG. 5 is a graph showing a relation between the data line capacitance and the bit line potential in the semiconductor memory device according to the first embodiment.

The effect on writing data to the SRAM cell SC in the semiconductor memory device of the present embodiment is described with reference to FIGS. 4 and 5. FIG. 4 shows operating waveforms in the SRAM according to the present embodiment. FIG. 4 shows waveforms of potentials on the bit line BLt, the boost enable signal boost_en, and the node N on writing. FIG. 5 is a graph showing a relation between the bit line capacitance and the bit line potential in the SRAM according to the present embodiment. FIG. 5 shows variations in the negative potential Vbl on the bit line BLt on writing when the bit line capacitance is varied small from 0.1 pF to 0.01 pF. The comparison example in FIG. 5 shows an example in driving the boot strap circuit, on a base of the time for the bit line having the longest bit line length to surely descend to 0 V, without using the replica write buffer circuit 2 according to the present embodiment.

In writing data to the SRAM cell, as the variation in the length of the bit line makes the capacitance C_bl smaller, the bit line can be discharged faster. In the SRAM of the present embodiment, the boost enable signal boost_en is controlled by the potential on the replica bit lines RBL having the capacitance corresponding to the bit line pair BL. Therefore, as shown in FIG. 4, even if the capacitance C_bl on the bit line BLt is made smaller to discharge the bit line BLt faster, the boost enable signal boost_en rises from "L" to "H" when the potential on the bit line BLt reaches almost 0 V. Thus, the SRAM of the present embodiment makes it possible to achieve an optimal timing for varying the boost enable signal boost_en to operate the boot strap circuit.

The following consideration is given to the value of the negative potential applied to the bit line when the bit line capacitance becomes smaller. As described before, if the bit line BLt has a capacitance C_bl, the potential level Vbl on the bit line BLt is represented by Vbl=−VDD*C_boost/C_bl.

It is herein assumed that the capacitance on the bit line BLt varies from C_bl to C_bl/2. In this case, the capacitance on the replica bit lines RBL configured to have double the capacitance on the bit line BLt also becomes half. Therefore, it is possible to make earlier the timing of the boost enable signal boost_en rising from "L" to "H" when the replica bit lines RBL are discharged. Thus, the length of discharge time for the node N can be reduced. If the node N has been discharged to VDD/2, the capacitive coupling with the capacitor C_boost lowers the voltage on the node N to around ½ the voltage −VDD. Thereafter, the potential level Vbl on the bit line BLt becomes as represented by the following expression 3.

$$Vbl = (-VDD/2) * (C\_boost/((C\_bl/2) + C\_boost)) \quad \text{[Expression 3]}$$

If the capacitance of the capacitor C_boost is sufficiently smaller than the capacitance C_bl/2 on the bit line BLt, the potential level Vbl on the bit line can be briefly represented by the following expression 4.

$$Vbl = -VDD * C\_boost/C\_bl \quad \text{[Expression 4]}$$

This has the same value as the potential level Vbl represented by the expression 2 in the case of the capacitance C_bl on the bit line BLt. Thus, even when the capacitance on the bit line BLt varies, the negative potential applied to the bit line BLt can be made at the same potential level. FIG. 4 shows that when the variation in capacitance on the bit line BLt makes earlier the timing of the boost enable signal boost_en to vary from "L" to "H", the timing of the node N varying to the negative potential also becomes gradually earlier. If the timing of the node N varying to the negative potential becomes earlier, the potential level on the node N at that time ascends. As the capacitance on the bit line BLt has varied, however, almost an identical negative potential can be generated as the potential level finally applied to the bit line BLt.

In the SRAM of the comparison example shown in FIG. 5, the boot strap circuit brings the bit line to a negative potential after the bit line BL surely reaches 0 V. Therefore, the smaller the bit line capacitance, the larger the bit line potential varies to lower the negative potential Vbl applied to the bit line. On the other hand, in the SRAM of the present embodiment, even if the bit line capacitance C_bl varies, the variation in the negative potential Vbl applied to the bit line is smaller.

As described above, the SRAM of the present embodiment uses the replica bit lines RBL to monitor the time for the potential on the bit line BLt to vary, which is fed back to the potential on the boot-strap capacitor C_boost in the boot strap circuit 3. Thus, even if the bit line length varies, the timing of applying a negative potential to the bit line BLt and the level of the negative potential applied can be optimized. The SRAM according to the present embodiment makes it possible to prevent the deterioration of the data write characteristic caused by the capacitance on the data line and execute writing on low voltage.

Second Embodiment

Figure 6:
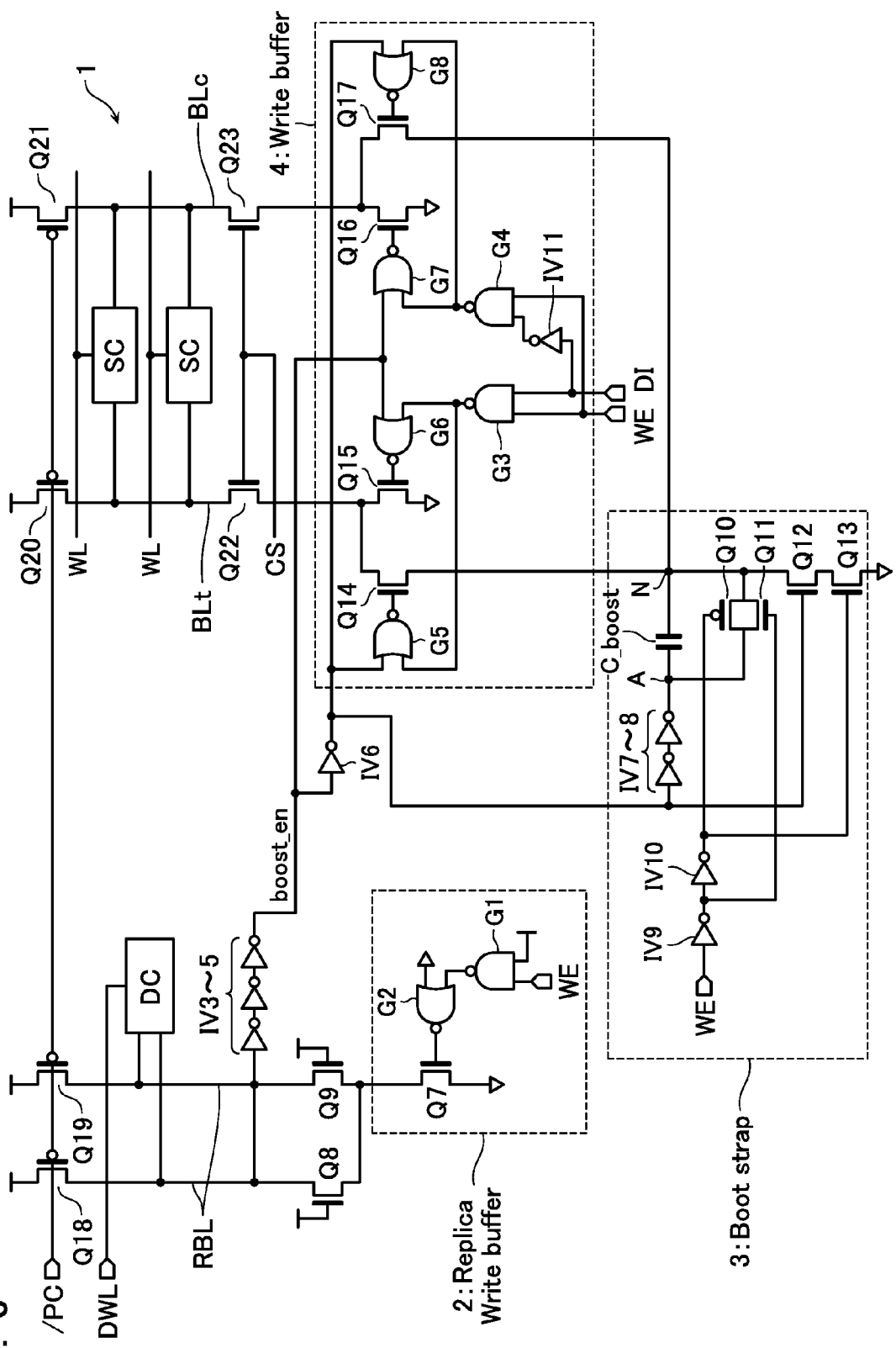
FIG. 6 is a circuit diagram showing a configuration of a semiconductor memory device according to a second embodiment.

A second embodiment of the present invention is described next with reference to FIG. 6 and so forth. FIG. 6 is a circuit diagram showing a configuration of a semiconductor memory device according to the second embodiment of the present invention.

[Configuration]

In the semiconductor memory device according to the present embodiment the parts having the same configurations as those in the SRAM of the first embodiment are denoted with the same reference numerals and omitted from the description. The SRAM according to the present embodiment includes a dummy cell DC connected to the replica bit lines RBL, different from the first embodiment.

The dummy cell DC has the same configuration as the normal SRAM cell SC shown in FIG. 2. In the dummy cell DC the transfer transistors Q5, Q6 have respective gates connected to a dummy word line DWL, different from the normal SRAM cell SC. FIG. 6 shows only one dummy cell DC though plural dummy cells are actually connected in parallel. In this case, the transistors used in the dummy cell DC and the normal SRAM cell SC are formed through the same process steps to have almost the same threshold voltage.

[Operation]

The replica write buffer circuit 2, the boot strap circuit 3 and the write buffer circuit 4 of the present embodiment operate in the same manner as in the first embodiment. In writing in the SRAM of the present embodiment, the dummy word line DWL is boosted to "H" at the same time as the timing when the normal selected word line WL is boosted to "H". Once the dummy word line DWL is selected, the dummy cell DC discharges the replica bit lines RBL through the transfer transistors Q5, Q6 and NMOS transistors Q2, Q4. Namely, in the SRAM of the present embodiment, the replica bit lines RBL are discharged by the dummy cell DC and the replica buffer circuit 2.

[Effect]

In discharge by the dummy cell DC, the threshold voltage of the NMOS transistor used in the dummy cell DC varies the rate of discharge from the replica bit lines RBL. Namely, the lower the threshold voltage of the NMOS transistor, the faster the potential on the replica bit lines RBL varies and the faster the state of the boost enable signal boost_en varies as well. On the other hand, the higher the threshold voltage of the NMOS transistor, the slower the potential on the replica bit lines RBL varies.

If the state of the boost enable signal boost_en varies faster, the boot strap circuit 3 performs an operation while the potential on the node N does not descend much and the potential level Vbl applied to the bit line BLt is elevated. If the state of the boost enable signal boost_en varies slower, the boot strap circuit 3 performs an operation after the potential on the node N fully descends and the potential level Vbl applied to the bit line BLt becomes lower. The transistors used in the dummy cell DC and the SRAM cell SC have almost the same threshold voltage. Therefore, as a result, the lower the threshold voltage of the NMOS transistor in the SRAM cell SC, the higher the potential level Vbl on the bit line BLt becomes. On the other hand, the higher the threshold voltage of the NMOS transistor, the lower the potential level Vbl on the bit line BLt becomes.

Figure 7:
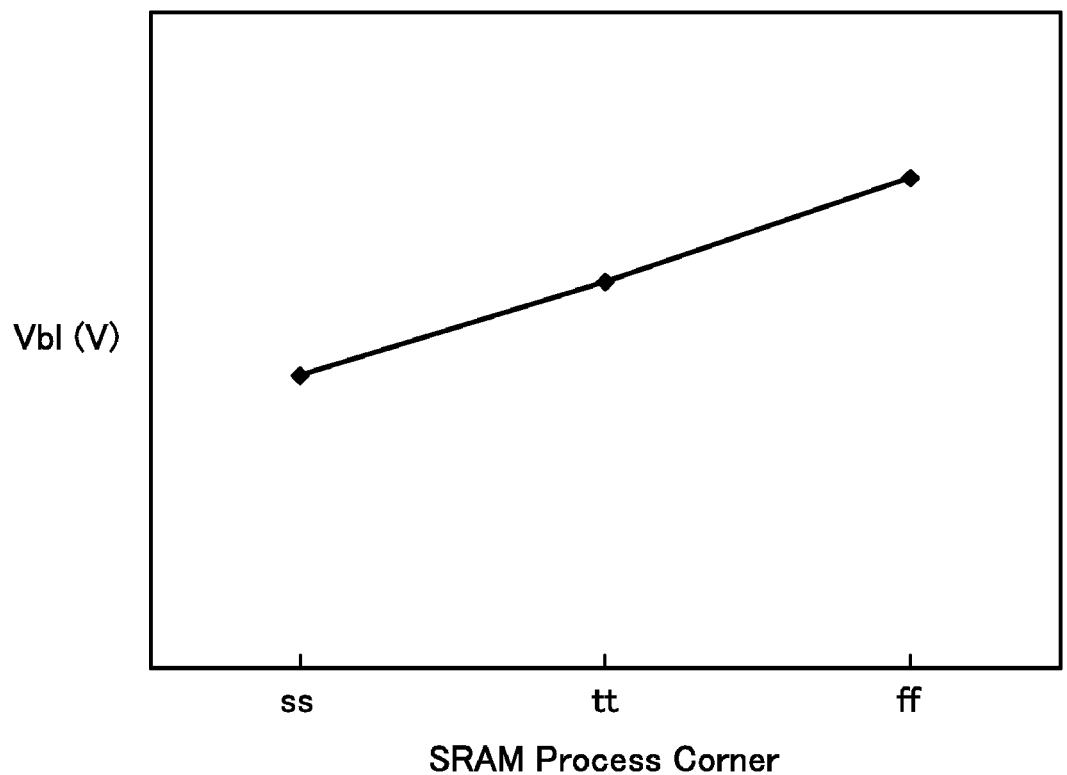
FIG. 7 is a graph showing a relation between the process condition and the bit line potential in the semiconductor memory device according to the second embodiment.

The state of the potential level Vbl is shown in FIG. 7. FIG. 7 is a graph showing a relation between the process condition (SRAM Process Corner) and the bit line potential in the SRAM according to the present embodiment. The process condition on the SRAM is represented by the operating speed based on the threshold voltage of the transistor. Namely, the threshold voltage of the transistor descends in order of slow-slow (ss) typical-typical (tt), and fast-fast (ff), and the operating speed becomes faster as shown. In the SRAM of the present embodiment, the lower the threshold voltage of the transistor, the higher the potential level Vbl on the bit line BLt becomes.

As described above, if the potential level Vbl on the bit line BLt descends excessively, in SRAM cells SC, which are connected to the same bit line BLt as the selected SRAM cell but associated word line WL are not selected, the gate-source voltage of the transfer transistors Q5, Q6 may possibly exceed the threshold voltage and destruct data held therein. In the present embodiment, however, as shown in FIG. 7, the lower the threshold voltage of the NMOS transistor in the SRAM cell SC, the higher the negative potential applied to the bit line BLt becomes and nears 0 V. Thus, the lower the threshold voltage and the more easily destructive the data in the SRAM cell becomes, the smaller the magnitude of the negative potential applied to the bit line BLt becomes. Accordingly, it is possible to effectively prevent data destruction.

In general, the write characteristic of the SRAM cell SC depends on the threshold voltage of the NMOS transistor used in the SRAM cell SC. Namely, the higher the threshold voltage, the worse the write characteristic becomes. In the present embodiment, however, if the threshold voltage of the NMOS transistor is higher and the write characteristic is worse, the level of the negative potential Vbl applied to the bit line descends. Accordingly, it is possible to improve the write characteristic. On the other hand, if the threshold voltage of the NMOS transistor is lower, the negative potential Vbl on the bit line BLt can be controlled not to descend too much. Accordingly, it is possible to suppress the power consumption in the SRAM.

Third Embodiment

Figure 8:
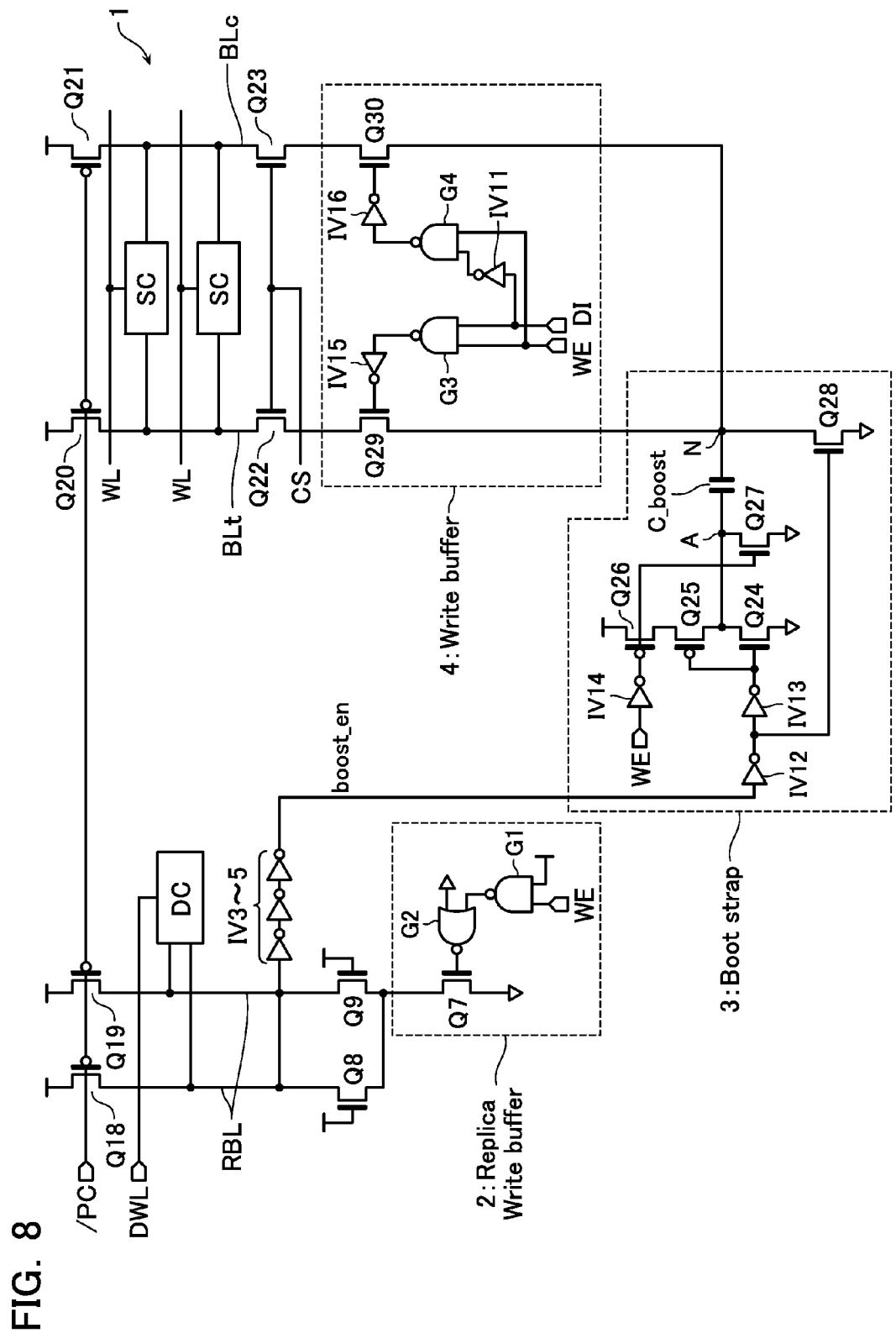
FIG. 8 is a circuit diagram showing a configuration of a semiconductor memory device according to a third embodiment.

A third embodiment of the present invention is described next with reference to FIG. 8 and so forth. FIG. 8 is a circuit diagram showing a configuration of a semiconductor memory device according to the third embodiment of the present invention.

[Configuration]

In the semiconductor memory device according to the present embodiment the parts having the same configurations as those in the SRAM of the second embodiment are denoted with the same reference numerals and omitted from the description. The SRAM according to the present embodiment differs from the second embodiment in configurations of the boot strap circuit 3 and the write buffer circuit 4.

The boot strap circuit 3 in the present embodiment includes inverters IV12-IV14, transistors Q24-Q28 and a boot strap capacitor C_boost. The output terminal of the inverter IV5 is connected to the input terminal of the inverter IV12 to feed the boost enable signal boost_en thereto. The output terminal of the inverter IV12 is connected via the inverter IV13 to the gate terminals of the NMOS transistor Q24 and the PMOS transistor Q25. The PMOS transistor Q26 and the NMOS transistor Q27 have respective gate terminals, which are supplied with the write enable signal WE via the inverter IV14. The transistors Q24-Q26 are connected in series between the supply line VDD and the groundline VSS. The connection portion between the transistors Q24 and Q25 is connected to the node A at one end of the capacitor C_boost. The transistor Q27 is connected between the node A and the ground line VSS. The node N is connected to the ground line VSS via the NMOS transistor Q28. The transistor Q28 has a gate terminal, which is supplied with the boost enable signal boost_en via the inverter IV12.

The write buffer circuit 4 of the present embodiment includes inverters IV11, IV15, IV16, NMOS transistors Q29, Q30, and NAND gates G3, G4. The gate G3 receives the write enable signal WE and the data signal DI. The gate G4 receives the write enable signal WE and the data signal DI via the inverter IV11. The gate G3 has an output terminal, which is connected to the gate terminal of the NMOS transistor Q29 via the inverter IV15. The gate G4 has an output terminal, which is connected to the gate terminal of the NMOS transistor Q30 via the inverter IV16. The bit lines BLt, BLc in the memory cell array 1 are connected to the ground line VSS via the transistors Q29, Q30 and the node N in the boot strap circuit 3. The write buffer circuit 4 has a function of connecting either of the pair of bit lines BL to the node N in the boot strap circuit 3 in accordance with write data at the start of writing.

[Operation]

The following description is given to data writing with the use of the replica write buffer circuit 2, the boot strap circuit 3 and the write buffer circuit 4 of the present embodiment shown in FIG. 8.

The write buffer circuit 4 receives the write enable signal WE and the boost enable signal boost_en, on writing, as well as a data signal DI corresponding to the write data. The data signal DI is herein assumed at "H". When the write enable signal WE and the data signal DI are at "H", the gate G3 provides an output signal at "L". In this case, the output signal from the inverter IV15 becomes "H" to connect the bit line BLt to the node N via the transistor Q29. On the other hand, the gate G4 provides an output signal at "H", which turns the output signal from the inverter IV16 to "L". This prevents the transistor Q30 from turning on and keeps the bit line BLc on the precharged voltage VDD.

As the boost enable signal boost_en and the write enable signal WE are both at "L" before writing, the boot strap circuit 3 discharges the node A and the node N to 0 V via the transistors Q28, Q29. When the write enable signal WE is turned to "H" to start writing, the transistor Q26 turns on to start charging the node A from the supply voltage VDD via the transistor Q26 and the transistor Q25 already turned on. The transistors Q25, Q26 are herein provided as a charge circuit for the capacitor C_boost.

When the boost enable signal boost_en turns from "L" to "H", the transistor Q28 turns off in the boot strap circuit 3. In addition, the transistor Q24 turns on to bring the potential on the node A from the charged voltage to the ground voltage 0 V. At this time, the capacitive coupling with the capacitor C_boost shifts the potential on the node N also in the negative direction. If the node A is charged up to the voltage VDD, the capacitive coupling with the capacitor C_boost lowers the node N from 0 V to around a voltage, −VDD. Thereafter, in accordance with the ratio between the capacitance C_bl on the bit line BLt and the capacitance on the capacitor C_boost in the boot strap circuit 3, charges are redistributed to determine the potential level Vbl on the bit line BLt as represented by the expression 2 in the first embodiment.

Thus, the bit line BLt of the bit line pair BL is brought to the negative potential and the bit line BLc to the supply voltage VDD. The potentials on the bit lines BLt, BLc are fed via the transfer transistors Q5, Q6 in the SRAM cell SC to the inverters IV1, IV2 to write data in the SRAM cell SC.

[Effect]

In the SRAM of the present embodiment, the node N is at 0 V when the boost enable signal boost_en is at "L". Therefore, in the write buffer circuit 4, it is not required to switch between the NMOS transistor operative to discharge the bit line pair BL to 0 V and the NMOS transistor operative to connect the bit line pair BL with the node N and shift it to the negative potential. This makes it possible to simplify the configuration of the write buffer circuit 4 and reduce the chip area.

Fourth Embodiment

Figure 9:
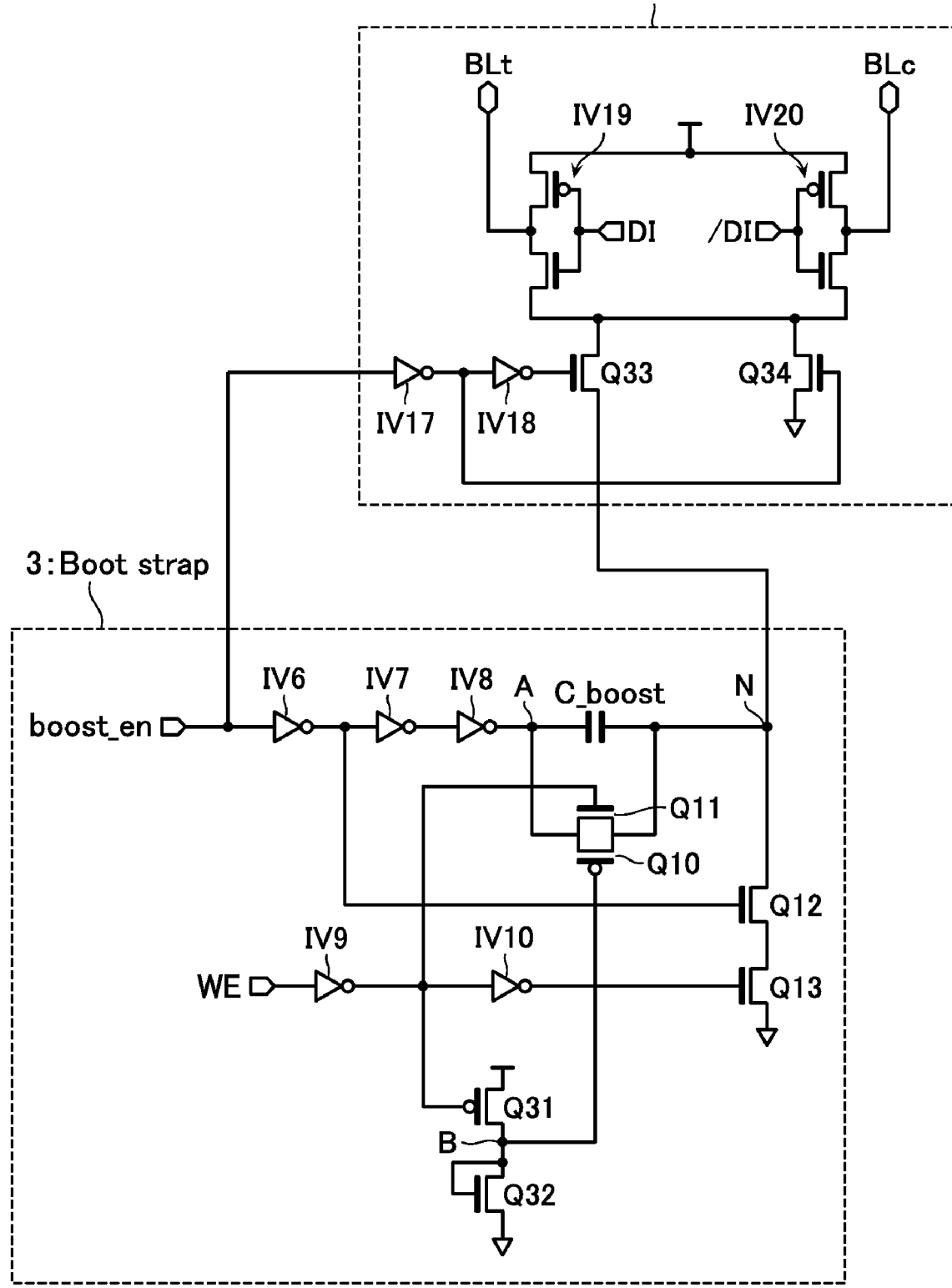
FIG. 9 is a circuit diagram showing a configuration of a semiconductor memory device according to a fourth embodiment.

A fourth embodiment of the present invention is described next with reference to FIG. 9 and so forth. FIG. 9 is a circuit diagram showing a configuration of a semiconductor memory device according to the fourth embodiment of the present invention. FIG. 9 selectively shows configurations of the boot strap circuit 3 and the write buffer circuit 4 only.

[Configuration]

In the semiconductor memory device according to the present embodiment the parts having the same configurations as those in the SRAM of the first and second embodiments are denoted with the same reference numerals and omitted from the description. The SRAM according to the present embodiment differs from the first and second embodiments in configurations of the boot strap circuit 3 and the write buffer circuit 4. In the SRAM of the present embodiment the inverter IV6 is shown as contained in the boot strap circuit 3.

In the boot strap circuit 3 according to the present embodiment the inverters IV6-IV12, the transistors Q10-Q13 and the boot strap capacitor C_boost have the same configurations as those in the boot strap circuit 3 of the first embodiment. The boot strap circuit 3 according to the present embodiment includes a PMOS transistor Q31 and an NMOS transistor Q32 connected between the inverter IV9 and the gate terminal of the transistor Q10, different from the first embodiment. The transistors Q31, Q32 are connected between the supply line VDD and the ground line VSS in series. The output terminal of the inverter IV9 is connected to the gate of the transistor Q31. The connection node B between the transistors Q31, Q32 is connected to the gate terminal of the transistor Q10 and to the gate terminal of the transistor Q32 as well.

The write buffer circuit 4 of the present embodiment includes inverters IV17-IV20, and NMOS transistors Q33, Q34. The boost enable signal boost_en is fed via the inverters IV17, IV18 to the gate of the transistor Q33 and to the gate of the transistor Q34 via the inverter IV17. The transistor Q33 has a source connected to the node N in the boot strap circuit. The transistor Q34 has a source connected to the ground line VSS. The inverters IV19, IV20 are connected between the supply line VDD and the transistors Q33, Q34. The input terminals of the inverters are supplied with mutually different data signals DI, /DI. The output terminals of the inverters IV19, IV20 are connected to the bit lines BLt, BLc, respectively.

[Operation]

The following description is given to data writing with the use of the boot strap circuit 3 and the write buffer circuit 4 of the present embodiment shown in FIG. 9.

In accordance with the write data signals DI, /DI, the write buffer circuit 4 connects either of the pair of bit lines BL (for example, the bit line BLc when the data signal DI is at "H" and /DI at "L") to the supply line VDD at the start of writing to precharge it to the voltage VDD. The boost enable signal boost_en is at "L" at the start of writing and thus the transistor Q34 turns on to discharge the bit line BLt to 0 V.

In the boot strap circuit 3, the boost enable signal boost_en is at "L" before writing. Thus, the node A at one end of the capacitor C_boost is brought to the voltage VDD via the inverters IV6-IV8. The write enable signal WE is also at "L". Thus, the node N at the other end is short-circuited with the node A via the transistors Q10, Q11 and brought to the voltage VDD. When the write enable signal WE is turned to "H" to start writing, the node A is made out of conduction with the node N, and the transistors Q12, Q13 turn on to discharge the node N.

When the write enable signal WE is at "H", the transistor Q31 turns on to bring the voltage on the node N to the voltage VDD. If the supply voltage VDD is lower and the potential level of the voltage VDD applied to the gate and drain of the transistor Q32 is lower than the threshold voltage Vth (Q32) of the transistor Q32, the transistor Q32 cannot turn on. In that case, the voltage VDD is applied to the gate terminal of the transistor Q10 to turn off the transistor Q10.

On the other hand, if the supply voltage VDD is higher and the potential level of the voltage VDD applied to the gate and drain of the transistor Q32 is higher than the threshold voltage Vth (Q32) of the transistor Q32, the transistor Q32 turns on. Therefore, the voltage applied to the gate terminal of the transistor Q10 descends to around Vth (Q32). When the drain-gate voltage VDD−Vth (Q32) of the transistor Q10 becomes lower than the threshold voltage Vth (Q10) of the transistor Q10, the transistor Q10 turns on. The condition for turning on the transistor Q10 is represented as follows using the absolute value of the threshold voltage Vth (Q10) of the transistor Q10.

$$VDD-Vth(Q32)>|Vth(Q10)|$$

$$\therefore VDD>Vth(Q32)+|Vth(Q10)| \quad \text{[Expression 5]}$$

Namely, if the supply voltage VDD is higher than Vth (Q32)+|Vth(Q10)|, the transistor Q10 turns on. After the start of writing, the transistors Q12, Q13 turn on to discharge the node N. In this case, if the transistor Q10 has turned on, the reduction in the potential on the node N is made slower. The transistors Q10, Q31, Q32 are provided as a potential control circuit, which varies the rate of discharging the node N in accordance with the value of the supply voltage VDD to vary the value of the negative potential applied to the bit line BLt.

When the boost enable signal boost_en turns from "L" to "H", in the write buffer circuit 4 the transistor Q34 turns off and the transistor Q33 connected to the node N in the boot strap circuit 3 turns on instead. In the boot strap circuit 3 the potential on the node A varies from the supply voltage VDD to the ground voltage 0 V. At this time, the capacitive coupling with the capacitor C_bost varies the potential on the node N in the negative direction as well. Thereafter, in accordance with the ratio between the capacitance C_bl on the bit line BLt and the capacitance on the capacitor C_boost in the boot strap circuit 3, charges are redistributed to bring the potential level Vbl on the bit line BLt to the negative potential.

Thus, the bit line BLt of the bit line pair BL is brought to the negative potential, and the bit line BLc to the supply voltage. The potentials on the bit lines BLt, BLc are fed via the transfer transistors Q5, Q6 in the SRAM cell SC to the inverters IV1, IV2 in the SRAM cell SC to write data in the SRAM cell SC.

[Effect]

Figure 10:
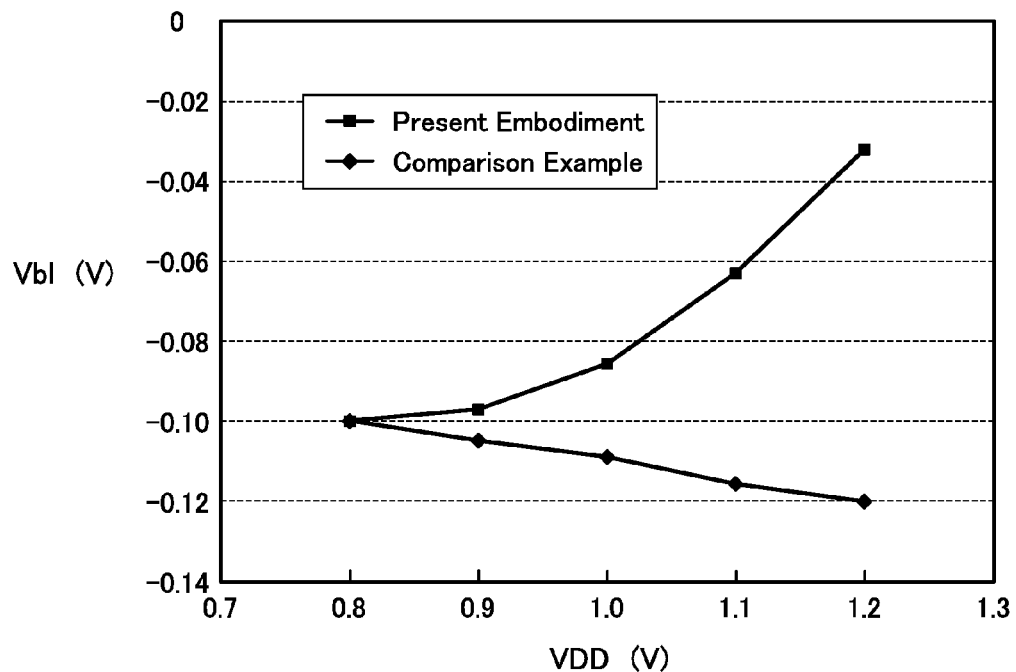
FIG. 10 is a graph showing a relation between the supply voltage and the bit line potential in the semiconductor memory device according to the fourth embodiment.

FIG. 10 is a graph showing a relation between the supply voltage and the bit line potential in the SRAM according to the present embodiment. FIG. 10 shows variations in the negative potential Vbl on the bit line BLt on writing while the supply voltage VDD is varied from 0.8 V to 1.2 V. The comparison example in FIG. 10 shows an example in driving the boot strap circuit, after the node N surely descends to 0 V, without using the boot strap circuit 3 according to the present embodiment.

In the boot strap circuit 3, when the potential on the node A varies from the supply voltage VDD to the ground voltage 0 V, the capacitive coupling with the capacitor C_boost lowers the potential on the node N. Namely, if the supply voltage VDD has a larger value, the potential on the node N may possibly descend largely and apply an excessive negative potential to the bit line BL. Therefore, as shown in FIG. 10, in the SRAM of the comparison example, the higher the supply voltage VDD, the lower the value of the bit line potential Vbl becomes. In general, from the viewpoint of reliability, the gate-source voltage available on the transfer transistor in the SRAM cell SC is limited. Therefore, it is required to set the value of the negative potential on the bit line BL tolerable for the available supply voltage VDD applied to the gate terminal of the transfer transistor. If the supply voltage VDD is lowered, the value of the negative potential on the bit line BLt is made smaller in accordance with the supply voltage VDD. This causes a problem because the negative potential sufficient to improve the write characteristic cannot be ensured at the time of low voltage.

On the other hand, in the SRAM of the present embodiment, if the value of the supply voltage VDD becomes larger than a certain value, the reduction in the potential on the node N after the start of writing becomes slower. In the SRAM of the present embodiment, as the value of the supply voltage VDD becomes larger than a certain value, the reduction in the potential on the node N can be suppressed correspondingly. Thereafter, even if the capacitive coupling with the capacitor C_boost lowers the potential on the node N, the potential Vbl on the bit line BLt can be prevented from lowering much. As a result, the lower the supply voltage VDD, the lower the value of the bit line potential Vbl becomes as shown in FIG. 10.

In FIG. 10, the bit line potential Vbl in the present embodiment and that in the comparison example are compared such that they become identical at the time of low voltage (VDD=0.8 V). If the gate-source voltage on the transfer transistor is set constant from the viewpoint of reliability, the SRAM of the present embodiment makes it possible to set a larger amount of boost at the time of low voltage than the comparison example.

Fifth Embodiment

Figure 11:
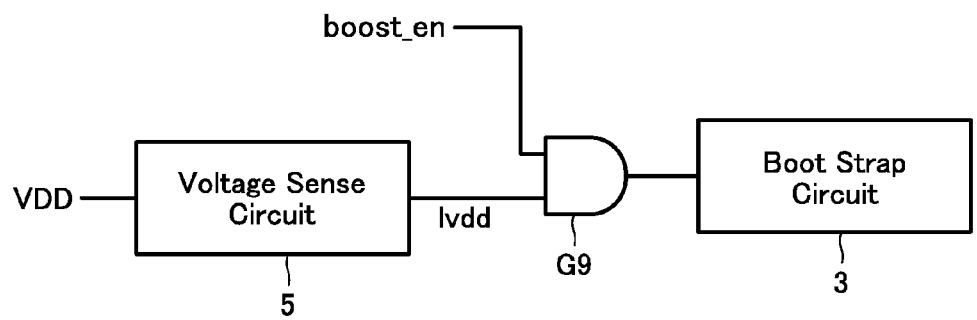
FIG. 11 is a block diagram showing a configuration of a semiconductor memory device according to a fifth embodiment.

A fifth embodiment of the present invention is described next with reference to FIG. 11 and so forth. FIG. 11 is a block diagram showing a configuration of a semiconductor memory device according to the fifth embodiment of the present invention. FIG. 11 selectively shows only configurations of the boot strap circuit 3 and a voltage sense circuit 5 operative to control operation of the boot strap circuit 3.

[Configuration]

The SRAM of the present embodiment includes a voltage sense circuit 5 operative to decide whether the supply voltage VDD is lower than a certain voltage. The voltage sense circuit 5 includes, for example, a reference voltage generator circuit comprising a band-gap reference circuit, and an op-amp operative to compare the reference voltage generated from the reference voltage generator circuit with the supply voltage VDD. The voltage sense circuit 5 provides a signal lvdd, which becomes "L" when the supply voltage VDD is higher than the reference voltage and "H" when the former is lower than the latter.

The boot strap circuit 3 receives the boost enable signal boost_en and the signal lvdd via an AND gate G9. Namely, the boot strap circuit 3 is activated only when the supply voltage VDD is lower than a certain potential and inactivated when the supply voltage VDD is higher than the certain potential.

[Effect]

As described in the fourth embodiment, if the supply voltage VDD has a larger value, the potential on the node N may descend largely and apply an excessive negative potential to the bitline BL possibly. In the SRAM of the present embodiment, however, if the supply voltage VDD is higher than a certain potential, the boot strap circuit 3 does not operate to generate a negative voltage. Thus, it is possible to set the potential level of the negative potential applied to the bit line at the time of low voltage without constraints of the breakdown voltage of the transfer transistor in the SRAM cell SC when the supply voltage VDD is a high voltage.

[Others]

The embodiments of the invention have been described above though the present invention is not limited to these embodiments but rather can be given various modifications, additions and so forth without departing from the scope and spirit of the invention. For example, the negative potential applied from the boot strap circuit 3 has such a threshold that is a value not higher than the breakdown voltage of the transfer transistor used in the SRAM cell SC even if the highest supply voltage of the use conditions for the SRAM is used. This makes it possible to set an appropriate amount of boost in the boot strap circuit.

In the fourth and fifth embodiments, the replica write buffer circuit 2 of the first embodiment is used together with the boot strap circuit 3 though the configuration for lowering the potential level of the negative potential applied to the bit line as the supply voltage VDD descends may also be used in general boot strap circuits.

What is claimed is:

1. A semiconductor memory device, comprising:
   a memory cell array including a plurality of word lines, a plurality of bit line pairs containing a first bit line and a second bit line intersecting said word lines, and a plurality of memory cells connected at the intersections of said plurality of word lines and said plurality of bit line pairs;
   a plurality of replica bit lines formed in the same manner as said first and second bit lines;
   a write buffer circuit operative to drive said first or second bit line to the ground voltage on writing data to said memory cell;
   a replica write buffer circuit operative to drive said replica bit lines to the ground voltage by substantially the same driving force as that of said write buffer circuit; and
   a boot strap circuit operative to drive said first or second bit line currently driven to the ground voltage further to a negative potential at a timing when the potential on said replica bit lines reaches a certain value.

2. The semiconductor memory device according to claim 1, further comprising an inverter circuit operative to activate a boost enable signal when it detects that the potential on said replica bit lines reaches the certain value,
   wherein the capacitance of said replica bit lines is substantially double the capacitance of said first or second bit line,
   wherein said certain value is substantially ½ the voltage value of the supply voltage,
   wherein said boot strap circuit controls the timing of driving said first or second bit line to the negative potential based on said boost enable signal.

3. The semiconductor memory device according to claim 1, further comprising a dummy cell connected to said replica bit lines and having substantially the same configuration as said memory cell,
   wherein said dummy cell is connected to a dummy word line that is to be selected at the same time as said word line on writing,
   wherein said dummy cell discharges said replica bit lines after said dummy word line is selected.

4. The semiconductor memory device according to claim 3, wherein said bootstrap circuit shifts the negative potential applied to either of said first or second bit line on writing to a lower potential as the threshold voltage of a transistor contained in said memory cell ascends.

5. The semiconductor memory device according to claim 2, wherein said boot strap circuit includes
   a capacitor element having one terminal connectable to said first or second bit line based on said boost enable signal, and
   a capacitor discharge circuit operative to discharge one terminal of said capacitor element until said boost enable signal is activated after the beginning of writing by said write buffer circuit,
   wherein said boot strap circuit connects said one terminal of said capacitor element to said first or second bit line when said boost enable signal is activated, and discharges the other terminal of said capacitor element to drive said first or second bit line to the negative potential.

6. The semiconductor memory device according to claim 5, wherein said boot strap circuit keeps substantially constant the potential level of the negative potential generated therein, regardless of the length of said bit line pair.

7. The semiconductor memory device according to claim 5, further comprising a dummy cell connected to said replica bit lines and having substantially the same configuration as said memory cell,
   wherein said dummy cell is connected to a dummy word line that is to be selected at the same time as said word line on writing,
   wherein said dummy cell discharges said replica bit lines after said dummy word line is selected.

8. The semiconductor memory device according to claim 2, wherein said boot strap circuit includes
   a capacitor element having one terminal connectable to said first or second bit line based on said boost enable signal, and
   a capacitor charge circuit operative to charge the other terminal of said capacitor element until said boost enable signal is activated after the beginning of writing by said write buffer circuit,
   wherein said boot strap circuit connects said one terminal of said capacitor element to said first or second bit line when said boost enable signal is activated, and discharges the other terminal of said capacitor element to drive said first or second bit line to the negative potential.

9. The semiconductor memory device according to claim 8, wherein said boot strap circuit keeps substantially constant the potential level of the negative potential generated therein, regardless of the length of said bit line pair.

10. The semiconductor memory device according to claim 8, further comprising a dummy cell connected to said replica bit lines and having substantially the same configuration as said memory cell,
    wherein said dummy cell is connected to a dummy word line that is to be selected at the same time as said word line on writing,
    wherein said dummy cell discharges said replica bit lines after said dummy word line is selected.

11. The semiconductor memory device according to claim 1, wherein said boot strap circuit uses a value not higher than the breakdown voltage of a transistor contained in said memory cell as the threshold voltage to control the negative potential.

12. The semiconductor memory device according to claim 1, wherein said memory cell is an SRAM cell including
    a first and a second inverter having mutually cross-connected input terminals and output terminals, each inverter containing a PMOS transistor and an NMOS transistor,
    a first transfer transistor connected between the output terminal of said first inverter and said first bit line and having a gate connected to said word line, and a second transfer transistor connected between the output terminal of said second inverter and said second bit line and having a gate connected to said word line.

13. The semiconductor memory device according to claim 1, wherein said boot strap circuit includes a potential control circuit operative to vary the value of the negative potential applied to said first or second bit line in accordance with the voltage value of the supply voltage, wherein said potential control circuit makes the negative potential larger in the negative direction as the voltage value of the supply voltage descends.

14. The semiconductor memory device according to claim 13, further comprising an inverter circuit operative to activate a boost enable signal when it detects that the potential on said replica bit lines reaches a certain value, wherein said boot strap circuit includes
a capacitor element having one terminal connectable to said first or second bit line based on said boost enable signal, and
a capacitor discharge circuit operative to discharge one terminal of said capacitor element until said boost enable signal is activated after the beginning of writing by said write buffer circuit,
wherein said potential control circuit varies the discharge rate at one terminal of said capacitor element in accordance with the voltage value of the supply voltage,
wherein said boot strap circuit connects said one terminal of said capacitor element to said first or second bit line when said boost enable signal is activated, and discharges the other terminal of said capacitor element to drive said first or second bit line to the negative potential.

15. The semiconductor memory device according to claim 13, wherein said potential control circuit includes
a first NMOS transistor having a source terminal connected to the ground potential, and a gate terminal and a drain terminal connected in common,
a first PMOS transistor having a source terminal connected to the power source, a drain terminal connected to the drain terminal and the gate terminal of said first NMOS transistor, and controlled on writing to turn on, and
a second PMOS transistor having a gate terminal connected to the gate terminal and the drain terminal of said first NMOS transistor and the drain terminal of said first PMOS transistor, a source terminal supplied with the supply voltage, and a drain terminal connected to one terminal of said capacitor element.

16. The semiconductor memory device according to claim 1, further comprising a voltage sense circuit operative to sense if the voltage value of the supply voltage is lower than a certain voltage value to provide a control signal for controlling operation of said boot strap circuit,
wherein said boot strap circuit drives said first or second bit line to the negative potential, based on said control signal, if the voltage value of the supply voltage is lower than the certain voltage value.

17. A semiconductor memory device, comprising:
a memory cell array including a plurality of word lines, a plurality of bit line pairs containing a first bit line and a second bit line intersecting said word lines, and a plurality of memory cells connected at the intersections of said plurality of word lines and said plurality of bit line pairs;

a write buffer circuit operative to drive said first or second bit line to the ground voltage on writing data to said memory cell; and
a boot strap circuit operative to drive said first or second bit line currently driven to the ground voltage further to a negative potential at a certain timing,
wherein said boot strap circuit includes a potential control circuit operative to vary the value of the negative potential applied to said first or second bit line in accordance with the voltage value of the supply voltage,
wherein said potential control circuit makes the negative potential larger in the negative direction as the voltage value of the supply voltage descends.

18. The semiconductor memory device according to claim 17, wherein said boot strap circuit includes
a capacitor element having one terminal connectable to said first or second bit line at said certain timing, and
a capacitor discharge circuit operative to discharge one terminal of said capacitor element until said certain timing after the beginning of writing by said write buffer circuit,
wherein said potential control circuit varies the discharge rate at one terminal of said capacitor element in accordance with the voltage value of the supply voltage,
wherein said boot strap circuit discharges the other terminal of said capacitor element to drive said first or second bit line to the negative potential.

19. The semiconductor memory device according to claim 17, wherein said potential control circuit includes
a first NMOS transistor having a source terminal connected to the ground potential, and a gate terminal and a drain terminal connected in common,
a first PMOS transistor having a source terminal connected to the power source, a drain terminal connected to the drain terminal and the gate terminal of said first NMOS transistor, and controlled on writing to turn on, and
a second PMOS transistor having a gate terminal connected to the gate terminal and the drain terminal of said first NMOS transistor and the drain terminal of said first PMOS transistor, a source terminal supplied with the supply voltage, and a drain terminal connected to one terminal of said capacitor element.

20. A semiconductor memory device, comprising:
a memory cell array including a plurality of word lines, a plurality of bit line pairs containing a first bit line and a second bit line intersecting said word lines, and a plurality of memory cells connected at the intersections of said plurality of word lines and said plurality of bit line pairs;
a write buffer circuit operative to drive said first or second bit line to the ground voltage on writing data to said memory cell;
a boot strap circuit operative to drive said first or second bit line currently driven to the ground voltage further to a negative potential at a certain timing; and
a voltage sense circuit operative to sense if the voltage value of the supply voltage is lower than a certain voltage value to provide a control signal for controlling operation of said boot strap circuit,
wherein said boot strap circuit drives said first or second bit line to the negative potential, based on said control signal, if the voltage value of the supply voltage is lower than the certain voltage value.

* * * * *